United States Patent
Dennis et al.

(10) Patent No.: US 8,377,738 B2
(45) Date of Patent: Feb. 19, 2013

(54) FABRICATION OF SOLAR CELLS WITH COUNTER DOPING PREVENTION

(75) Inventors: Timothy D. Dennis, Canton, TX (US); Bo Li, San Jose, CA (US); Peter John Cousins, Menlo Park, CA (US)

(73) Assignee: SunPower Corporation, San Jose, CA (US)

( * ) Notice: Subject to any disclaimer, the term of this patent is extended or adjusted under 35 U.S.C. 154(b) by 271 days.

(21) Appl. No.: 12/828,573

(22) Filed: Jul. 1, 2010

(65) Prior Publication Data

US 2012/0000522 A1    Jan. 5, 2012

(51) Int. Cl.
*H01L 31/0288*    (2006.01)

(52) U.S. Cl. .................. 438/97; 438/563; 257/E31.014

(58) Field of Classification Search .................... 438/57, 438/97, 548, 558, 563; 257/E31.011, E31.014, 257/E21.149
See application file for complete search history.

(56) References Cited

U.S. PATENT DOCUMENTS

| | | |
|---|---|---|
| 3,961,997 A | 6/1976 | Chu |
| 4,070,097 A | 1/1978 | Gelber et al. |
| 4,084,099 A | 4/1978 | Harvey et al. |
| 4,278,831 A | 7/1981 | Riemer et al. |
| 4,427,839 A | 1/1984 | Hall |
| 4,478,879 A | 10/1984 | Baraona et al. |
| 4,496,788 A | 1/1985 | Hamakawa et al. |
| 4,665,277 A | 5/1987 | Sah et al. |
| 4,927,770 A | 5/1990 | Swanson |
| 5,030,295 A | 7/1991 | Swanson et al. |
| 5,053,083 A | 10/1991 | Sinton |
| 5,057,439 A | 10/1991 | Swanson et al. |
| 5,066,340 A | 11/1991 | Iwamoto et al. |
| 5,164,019 A | 11/1992 | Sinton |
| 5,213,628 A | 5/1993 | Noguchi et al. |
| 5,217,539 A | 6/1993 | Fraas et al. |
| 5,266,125 A | 11/1993 | Rand et al. |
| 5,360,990 A | 11/1994 | Swanson |
| 5,369,291 A | 11/1994 | Swanson |
| 5,391,235 A | 2/1995 | Inoue |
| 5,468,652 A | 11/1995 | Gee |
| 5,512,757 A | 4/1996 | Cederstrand et al. |
| 5,641,362 A | 6/1997 | Meier |
| 5,728,230 A | 3/1998 | Komori et al. |
| 5,918,140 A | 6/1999 | Wickboldt et al. |
| 6,013,582 A | 1/2000 | Ionov et al. |
| 6,096,968 A | 8/2000 | Schlosser et al. |
| 6,118,258 A | 9/2000 | Farine et al. |
| 6,143,976 A | 11/2000 | Endros |

(Continued)

OTHER PUBLICATIONS

PCT International Search Report for Application No. PCT/US11/33613, Aug. 25, 2011, 4 sheets.

(Continued)

*Primary Examiner* — Julio J Maldonado
*Assistant Examiner* — Daniel Shook
(74) *Attorney, Agent, or Firm* — Okamoto & Benedicto LLP

(57) ABSTRACT

A solar cell fabrication process includes printing of dopant sources over a polysilicon layer over backside of a solar cell substrate. The dopant sources are cured to diffuse dopants from the dopant sources into the polysilicon layer to form diffusion regions, and to crosslink the dopant sources to make them resistant to a subsequently performed texturing process. To prevent counter doping, dopants from one of the dopant sources are prevented from outgassing and diffusing into the other dopant source. For example, phosphorus from an N-type dopant source is prevented from diffusing to a P-type dopant source comprising boron.

6 Claims, 4 Drawing Sheets

U.S. PATENT DOCUMENTS

| | | | |
|---|---|---|---|
| 6,147,297 A | 11/2000 | Wettling et al. | |
| 6,210,991 B1 | 4/2001 | Wenham et al. | |
| 6,262,359 B1 | 7/2001 | Meier et al. | |
| 6,274,402 B1 | 8/2001 | Verlinden et al. | |
| 6,274,404 B1 | 8/2001 | Hirasawa et al. | |
| 6,278,054 B1 | 8/2001 | Ho et al. | |
| 6,313,395 B1 | 11/2001 | Crane et al. | |
| 6,333,457 B1 | 12/2001 | Mulligan et al. | |
| 6,337,283 B1 | 1/2002 | Verlinden et al. | |
| 6,387,726 B1 | 5/2002 | Verlinden et al. | |
| 6,423,568 B1 | 7/2002 | Verlinden et al. | |
| 6,429,037 B1 | 8/2002 | Wenham et al. | |
| 6,465,724 B1 | 10/2002 | Garvison et al. | |
| 6,524,880 B2 | 2/2003 | Moon et al. | |
| 6,552,414 B1 | 4/2003 | Horzel et al. | |
| 6,692,985 B2 | 2/2004 | Huang et al. | |
| 6,777,610 B2 | 8/2004 | Yamada et al. | |
| 6,844,248 B2 | 1/2005 | Naseem et al. | |
| 6,872,321 B2 | 3/2005 | Thavarajah et al. | |
| 6,998,288 B1 | 2/2006 | Smith et al. | |
| 7,135,350 B1 | 11/2006 | Smith et al. | |
| 7,217,883 B2 | 5/2007 | Munzer | |
| 7,238,594 B2 | 7/2007 | Fonash et al. | |
| 7,280,235 B2 | 10/2007 | Lapstun et al. | |
| 7,281,786 B2 | 10/2007 | Silverbrook | |
| 7,292,368 B2 | 11/2007 | Rozzi | |
| 7,306,307 B2 | 12/2007 | Lapstun et al. | |
| 7,306,325 B2 | 12/2007 | Silverbrook et al. | |
| 7,309,020 B2 | 12/2007 | Anderson et al. | |
| 7,322,669 B2 | 1/2008 | Berry et al. | |
| 7,322,673 B2 | 1/2008 | Silverbrook et al. | |
| 7,328,966 B2 | 2/2008 | Silverbrook | |
| 7,335,555 B2 | 2/2008 | Gee et al. | |
| 7,341,328 B2 | 3/2008 | Berry et al. | |
| 7,357,476 B2 | 4/2008 | Berry et al. | |
| 7,468,485 B1 | 12/2008 | Swanson | |
| 7,517,709 B1 | 4/2009 | Borden | |
| 7,554,031 B2 | 6/2009 | Swanson et al. | |
| 7,633,006 B1 | 12/2009 | Swanson | |
| 7,786,375 B2 | 8/2010 | Swanson et al. | |
| 2002/0020440 A1 | 2/2002 | Yoshimine et al. | |
| 2003/0070707 A1 | 4/2003 | King et al. | |
| 2003/0076649 A1 | 4/2003 | Speakman | |
| 2003/0134469 A1 | 7/2003 | Horzel et al. | |
| 2003/0178056 A1 | 9/2003 | Hikosaka et al. | |
| 2004/0200520 A1 | 10/2004 | Mulligan et al. | |
| 2005/0268963 A1 | 12/2005 | Jordan et al. | |
| 2006/0130891 A1 | 6/2006 | Carlson | |
| 2006/0157103 A1 | 7/2006 | Sheats et al. | |
| 2006/0196535 A1 | 9/2006 | Swanson et al. | |
| 2007/0082206 A1 | 4/2007 | Hartig | |
| 2007/0151598 A1* | 7/2007 | De Ceuster et al. | 136/256 |
| 2007/0269750 A1 | 11/2007 | Irving et al. | |
| 2007/0287237 A1* | 12/2007 | Rockenberger et al. | 438/163 |
| 2008/0044964 A1 | 2/2008 | Kamath et al. | |
| 2009/0085095 A1 | 4/2009 | Kamath et al. | |
| 2009/0205712 A1 | 8/2009 | Cousins | |
| 2009/0266401 A1 | 10/2009 | Stangl et al. | |
| 2009/0301549 A1 | 12/2009 | Moslehi | |
| 2010/0047589 A1 | 2/2010 | Ochs et al. | |
| 2010/0075234 A1 | 3/2010 | Cousins | |
| 2010/0081264 A1 | 4/2010 | Leung et al. | |
| 2010/0139740 A1 | 6/2010 | Xavier et al. | |
| 2010/0139764 A1 | 6/2010 | Smith | |

OTHER PUBLICATIONS

SunPower Discovers the "Surface Polarization" Effect in High Efficiency Solar Cells, Aug. 2005, pp. 1-4, Source: SunTechnics SunReader.

R. Swanson, et al., "The Surface Polarization Effect in High-Effiency Silicon Solar Cells", submitted for publication to the 15th International Photovoltaic Science and Engineering Conference & Solar Energy Exhibition, Oct. 10-15, 2005 (4 sheets), Shanghai, China.

Jianhua Zhao, et al., "Performance Instability in N-Type Pert Silicon Solar Cells", The 3rd World Conference on Photovoltaic Energy Conversion, May 12-16, 2003 (4 sheets), Osaka, Japan.

S.M. Sze "Physics of Semiconductor Devices", 1981 Second Edition, pp. 362-369, Copyright by John Wiley & Sons, Inc., U.S.

W.P. Mulligan, et al. "A Flat-Plate Concentrator: Micro-Concentrator Design Overview", 2000, 3 sheets, Proceedings of the 28th IEEE PVSC.

K. R. McIntosh, et al. "The Choice of Silicon Wafer for the Production of Low-Cost Rear-Contact Solar Cells", May 2003, 4 sheets, Sunpower Corporation, Sunnyvale, CA.

P.J. Verlinden, et al. "Will We have a 20%-Efficient(PTC) Photovoltaic System?", 2001, 6 sheets, Proceedings of the 17th Europe Photovoltaic Solar Energy Conference.

William P. Mulligan, et al. "Development of Chip-Size Silicon Solar Cells", 2000, 6 sheets, Proceedings of the 28th IEEE PVSC.

Akira Terao, et al. "A Mirror-Less Design for Micro-Concentrator Modules", 2000, 4 sheets, Proceedings of the 28th IEEE PVSC.

P.J. Verlinden, et al. "Backside-Contact Silicon Solar Cells with Improved Efficiency for the '96 World Solar Challenge", 1997, 5 sheets, Proceedings of the 15th EPSEC.

P.J.Verlinden, et al. "One-Year Comparison of a Concentrator Module with Silicon Point-Contact Solar Cell to a Fixed Flat Plate Module in Northern California", 2000, 4 sheet, Proceedings of the 16th EPSEC.

Richard M. Swanson, "The Promise of Concentrators", 2000, Prog. Photovolt. Res. Appl. 8, pp. 93-111 (2000), Sunpower Corporation, Sunnyvale, CA.

Ronald A. Sinton, et al. "Simplified Backside-Contact Solar Cells", Feb. 1990, pp. 348-352, IEEE Transactions on Electron Devices, vol. 37. No. 2.

Ronald A. Sinton, "Device Physics and Characterization of Silicon Point-Contact Solar Cells", Feb. 1997, pp. 1-154, Stanford Electronics Laboratories, Stanford University, CA.

Richard Roland King, "Studies of Oxide-Passivated Emitters in Silicon and Applications to Solar Cells", Aug. 1990, pp. 1-200, (Thesis) Electrical Engineering Department of Stanford University, CA.

Eric Fogarassy, et al. "Long-Pulse Excimer Laser Crystallization and Doping for the Fabrication of High Performance Polysilicon TFTs", Jan. 2006, pp. S40-S46, Journal of the Korean Physical Society, vol. 48.

Ted Kamins, "Polycrystalline Silicon for Integrated Circuit Applications" third printing 1994, pp. 198-199, Kluwer Academic Publishers, Norwell, Massachusetts.

J.Y. Lee, et al. "Boron-Back Surface Field With Spin-On Dopants by Rapid Thermal Processing", Jun. 2004, pp. 998-1001, 19th European Photovoltaic Solar Energy Conference, Paris, France.

* cited by examiner

FABRICATION OF SOLAR CELLS WITH COUNTER DOPING PREVENTION

STATEMENT REGARDING FEDERALLY SPONSORED RESEARCH OR DEVELOPMENT

This disclosure was made with Government support under Contract No. DEFC36-07GO17043 awarded by the United States Department of Energy.

BACKGROUND OF THE INVENTION

1. Field of the Invention

The present invention relates generally to solar cells, and more particularly but not exclusively to solar cell fabrication processes and structures.

2. Description of the Background Art

Solar cells are well known devices for converting solar radiation to electrical energy. They may be fabricated on a semiconductor wafer using semiconductor processing technology. A solar cell includes P-type and N-type diffusion regions. Solar radiation impinging on the solar cell creates electrons and holes that migrate to the diffusion regions, thereby creating voltage differentials between the diffusion regions. In a backside contact solar cell, both the diffusion regions and the metal contact fingers coupled to them are on the backside of the solar cell. The contact fingers allow an external electrical circuit to be coupled to and be powered by the solar cell.

Efficiency is an important characteristic of a solar cell as it is directly related to the solar cell's capability to generate power. Accordingly, techniques for improving the efficiency of solar cells are generally desirable. In addition, it is desirable to cut the cost of fabricating solar cells to make them competitive against other energy sources.

SUMMARY

In one embodiment, a solar cell fabrication process includes printing of dopant sources over a polysilicon layer over backside of a solar cell substrate. The dopant sources are cured to diffuse dopants from the dopant sources into the polysilicon layer to form diffusion regions, and to crosslink the dopant sources to make them resistant to a subsequently performed texturing process. To prevent counter doping, dopants from one of the dopant sources are prevented from outgassing and diffusing into the other dopant source. For example, phosphorus from an N-type dopant source is prevented from diffusing to a P-type dopant source comprising boron.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of apparatus, process parameters, materials, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

FIGS. 1-5 show cross sections schematically illustrating the fabrication of a solar cell in accordance with an embodiment of the present invention. In the example of FIGS. 1-5, and also FIGS. 7 and 8, the solar cell being fabricated is a backside contact solar cell in that the P-type and N-type diffusion regions of the solar cell and corresponding metal contact fingers are formed over the backside of the solar cell substrate.

FIGS. 1-5 schematically illustrate a process that includes the following process steps:
a) Damage etch step.
b) Polysilicon deposition.
c) Printing of dopant sources.
d) Curing step.
e) Trench formation
f) Texturing step.

In this example, the just mentioned process steps are performed in the order shown. It is to be noted that other process steps not necessary for the understanding of the invention are omitted in the interest of clarity. For example, other process steps, such as formation of metal contacts to the P-type and N-type diffusion regions, follow the texturing step to complete the fabrication of the solar cell.

Figure 1:
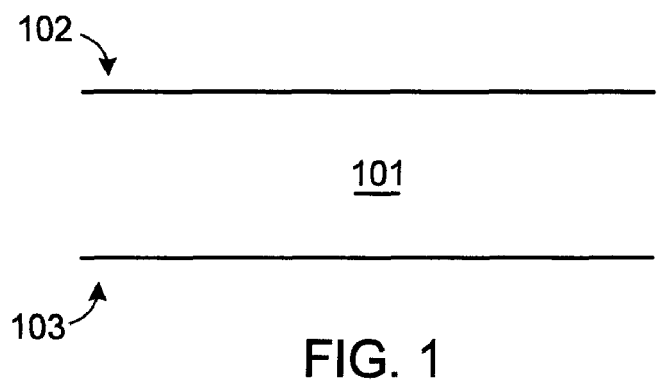
FIGS. 1-5 show cross sections schematically illustrating the fabrication of a solar cell in accordance with an embodiment of the present invention.

FIG. 1 shows a solar cell substrate 101 having a backside 102 and a front side 103. The front side 103 faces the sun to collect solar radiation during normal operation. The backside 102 is opposite the front side 103. The substrate 101 is prepared for processing into a solar cell by undergoing a damage etch step. The substrate 101 comprises an N-type silicon wafer in this example, and is typically received with damaged surfaces due to the sawing process used by the wafer vendor to slice the substrate 101 from its ingot. The substrate 101 may be about 100 to 200 microns thick as received from the wafer vendor. In one embodiment, the damage etch step involves removal of about 10 to 20 μm from each side of the substrate 101 using a wet etch process comprising potassium hydroxide. The damage etch step may also include cleaning of the substrate 101 to remove metal contamination. Thin dielectric layers (not labeled) are formed on the front side and backside surfaces of the substrate 101. The thin dielectric layers may comprise silicon dioxide thermally grown to a thickness less than or equal to 20 Angstroms (e.g., 16 Angstroms) on both surfaces of the substrate 101. The front side surface of the substrate 101 and materials formed thereon are also referred to as being on the front side of the solar cell because they face the sun to receive solar radiation during normal operation. Similarly, the backside surface of the substrate 101 and materials formed thereon are also referred to as being on the backside of the solar cell, which is opposite the front side.

Figure 2:
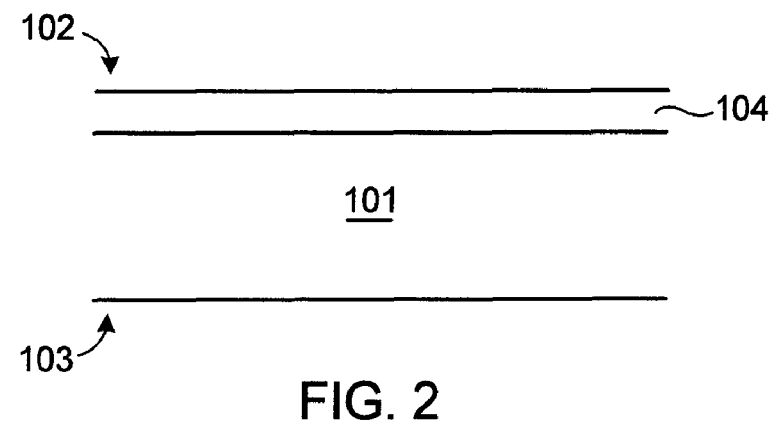

In FIG. 2, a polysilicon layer 104 is formed on the thin dielectric layer on the backside 102 of the substrate 101. The polysilicon layer 104, which is undoped at this stage of the fabrication process, may be formed to a thickness of about 2200 Angstroms by LPCVD.

Figure 3:
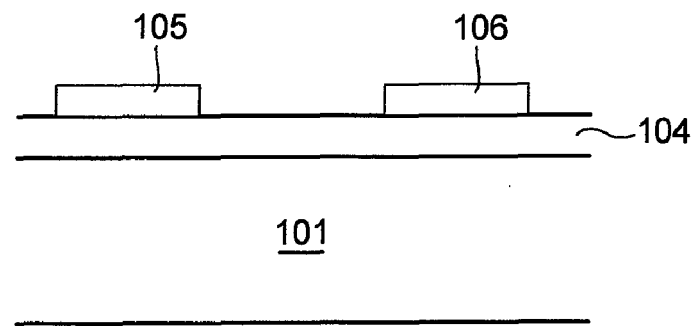

In FIG. 3, dopant sources 105 and 106 are printed on the polysilicon layer 104. As will be more apparent below, the dopant sources 105 and 106 provide dopants for forming diffusion regions in the polysilicon layer 104 on the backside of the solar cell.

Several dopant sources 105 and 106 are formed for any given solar cell, but only one of each is shown in FIG. 3 for clarity of illustration.

The dopant sources 105 and 106, which comprise printable inks, have different conductivity types. In the example of FIG. 3, the dopant source 105 is a P-type dopant source and the dopant source 106 is an N-type dopant source. The dopant sources 105 and 106 are formed on the polysilicon layer 104 by printing, such as inkjet printing or screen printing. Inkjet printing advantageously allows for printing of both dopant sources 105 and 106 in a single pass of the inkjet printer nozzle over the substrate 101. The dopant sources 105 and 106 may also be printed in separate passes depending on the process.

Figure 4:
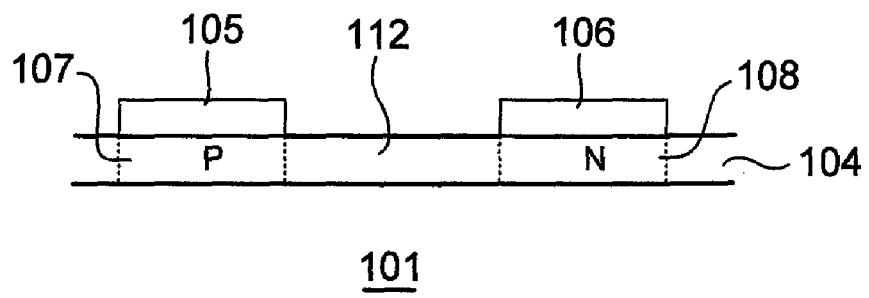

In FIG. 4, a curing step is performed to crosslink the dopant source 105, to crosslink the dopant source 106, to diffuse dopants from the dopant source 105 into the polysilicon layer 104 to form a P-type diffusion region 107 in the polysilicon layer 104, and to diffuse dopants from the dopant source 106 into the polysilicon layer 104 to form an N-type diffusion region 108 in the polysilicon layer 104. There is a plurality of P-type diffusion regions 107 and N-type diffusion regions 108 in the polysilicon layer 104 because of the plurality of dopant sources 105 and 106 on the polysilicon layer 104. The crosslinking of the dopant source 105 and the crosslinking of the dopant source 106 make the dopant sources 105 and 106 more durable and tough to withstand a subsequent texturing step (see FIG. 5) performed on a trench and the front side of the solar cell. The crosslinking and diffusion are performed in the same curing step to cut down on the number of process steps, thereby lowering the fabrication cost of the solar cell. The curing step may be performed for about 30 minutes at a temperature range between 600° C. and 1100° C. (e.g., 950° C.).

For improved solar cell performance, the curing step is performed such that diffusion of N-type dopants from the dopant source 106 to the P-type dopant source 105 is prevented or minimized. Studies performed by the inventors indicate that it is possible for N-type dopants from the dopant source 106 to counter dope P-type dopants in the dopant source 105 during the curing step. The inventors discovered that the counter doping is due to outgassing of N-type dopants, which in this example comprise phosphorus, to the P-type dopant source 105 comprising boron. In some cases, the resulting phosphorus concentration is more than the boron concentration in the P-type dopant source 105. The inventors also discovered that it is possible for N-type dopants from the dopant source 106 to dope regions (labeled as 112 in FIG. 4) between the P-type diffusion region 107 and the N-type diffusion region 108. The counter doping, i.e., diffusion of N-type dopants from the dopant source 106 into the P-type dopant source 105, degrades the performance of the solar cell by reducing the lifetime of the solar cell substrate 101 and reducing the efficiency of the solar cell. P-type dopants from the P-type dopant source 105 also diffuse into the N-type dopant source 106 during the curing step. However, studies performed by the inventors indicate that this does not impact the performance of the solar cell as much as the diffusion of N-type dopants from the N-type dopant source 106 to the P-type dopant source 105. Performing the curing step with counter doping prevention advantageously addresses problems discovered by the inventors.

Figure 5:
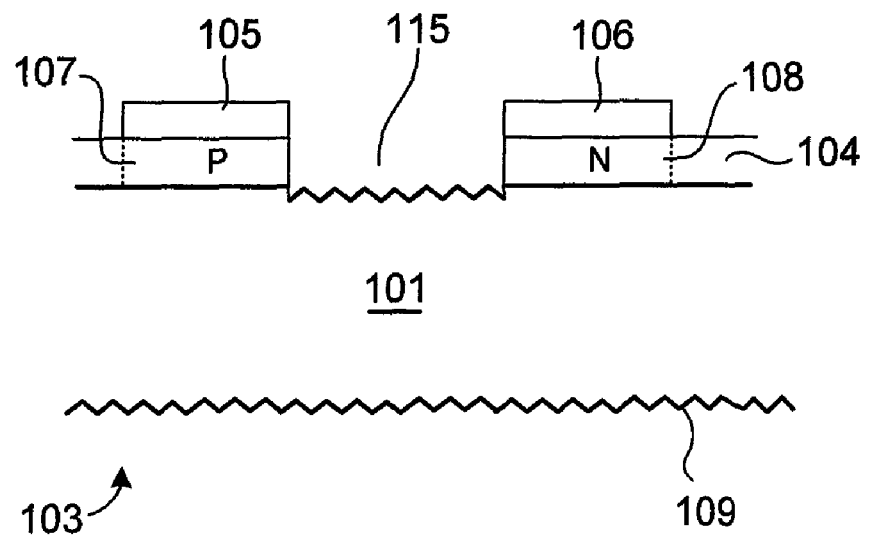

In FIG. 5, a trench 115 is formed through the polysilicon layer 104. The front side surface of the substrate 101 is randomly textured to form a textured surface 109. The texturing process also randomly textures the trench 115. In one embodiment, the front side surface of the substrate 101 and the trench 115 are textured with random pyramids using a wet etch process comprising potassium hydroxide and isopropyl alcohol. The textured surface 109 helps increase solar radiation collection. The etchant used in the etch process can potentially degrade the dopant sources 105 and 106. The curing step crosslinks each of the dopant sources 105 and 106 to make them more resistant to the etchant. Preventing or minimizing diffusion of N-type dopants from the N-type dopant source 106 to the P-type dopant source 105 during the curing step also helps make the dopant sources 105 and 106 more resistant to etchants employed in the texturing process.

In one embodiment, diffusion of N-type dopants from the dopant source 106 into the P-type dopant source 105 during curing is prevented or minimized by using a thermally stable ink. In one embodiment, the N-type dopant source 106 comprises a thermally stable ink comprising borophosphosilicate glass (BPSG). The boron content of the BPSG may be optimized to encourage pushing of the phosphorus into the polysilicon layer 104 rather than outgas during the curing step. For example, the percent composition of boron may range from 0.1% to 5% and the percent composition of phosphorus may range from 5% to 8% in the BPSG. As a particular example, the BPSG may have (a) 5% boron and 5% phosphorus, (b) 3% boron and 5% phosphorus, or (c) 5% boron and 8% phosphorus. The percent composition of boron and phosphorus in the BPSG may vary depending on the process. In general, the percent composition of boron is kept low enough to achieve the pushing effect without counter doping the N-type dopant source 106. The BPSG is in a form suitable for printing.

In one embodiment, diffusion of N-type dopants from the dopant source 106 into the P-type dopant source 105 during curing is prevented or minimized by shortening the curing time. For example, the sample of FIG. 4 may be cured by rapid thermal processing. As a particular example, the sample of FIG. 4 may be subjected to rapid thermal processing for about 1 to 2 minutes. The relatively short curing time minimizes the amount of N-type dopants outgassing from the N-type dopant source 106 and diffusing into the P-type dopant source 105.

In one embodiment, diffusion of N-type dopants from the dopant source 106 into the P-type dopant source 105 during curing is prevented or minimized by making the P-type dopant source 105 suitably thick such that the N-type dopants do not diffuse deep into the P-type dopant source 105. For example, the P-type dopant source 105 may be formed to a thickness of at least 3000 Angstroms to make it more resistant to counter doping by N-type dopants.

Figure 6:
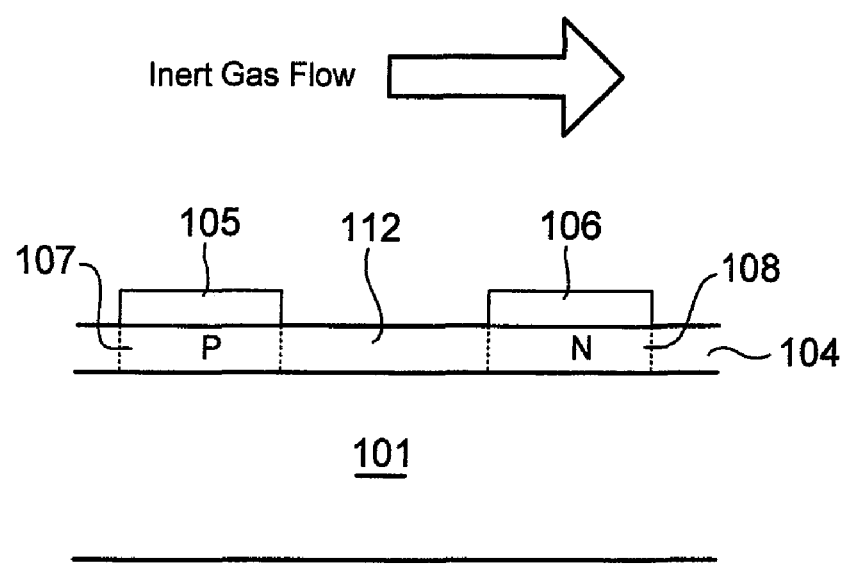
FIG. 6 schematically shows purging of a chamber to prevent counter doping in accordance with an embodiment of the present invention.

In one embodiment, diffusion of N-type dopants from the dopant source 106 into the P-type dopant source 105 during curing is prevented or minimized by purging dopants outgassing from the N-type dopant source 106 out of the chamber where the solar cell is being cured. For example, as illustrated in FIG. 6, an inert gas (e.g., nitrogen) may be flown through the chamber during the curing step of the sample of FIG. 4 to purge outgassing dopants (phosphorus in this example) out of the chamber before the dopants have a chance to diffuse to a dopant source. As another example, the dopant sources 105 and 106 may be cured in a chamber under low pressure. The low pressure pulls outgassing N-type dopants out of the chamber instead of diffusing into the P-type dopant source 105.

Figure 7:
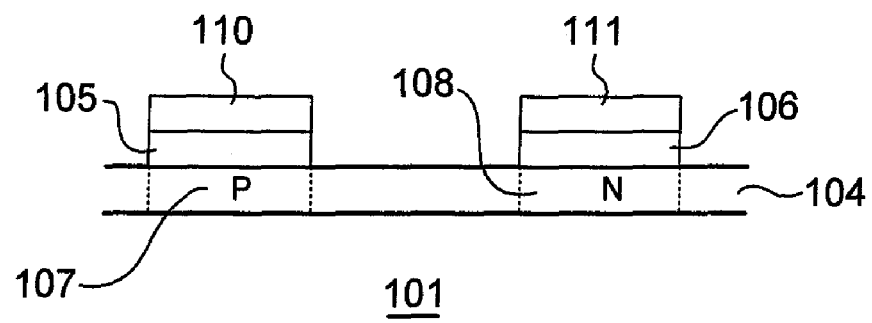
FIGS. 7 and 8 show cross sections schematically illustrating alternative process steps that include formation of capping layers over dopant sources in accordance with an embodiment of the present invention.
Figure 8:
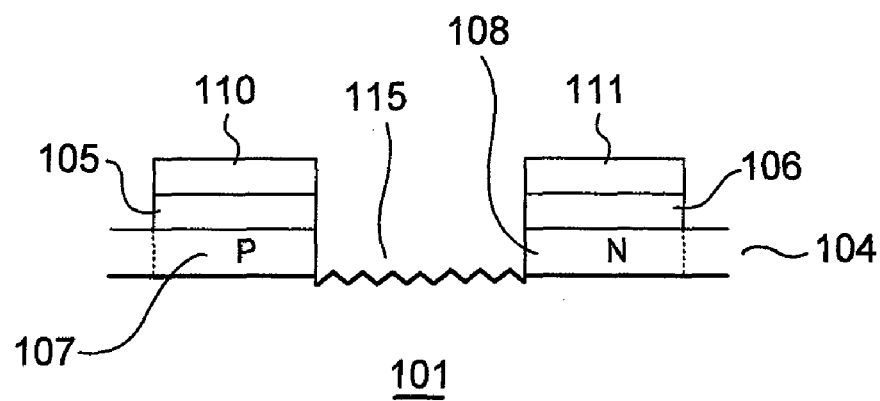

In one embodiment, diffusion of N-type dopants from the dopant source 106 into the P-type dopant source 105 during curing is prevented or minimized by forming a capping layer on the N-type dopant source 106 before the curing step. In the example of FIG. 7, a capping layer 110 is formed on the P-type dopant source 105 and a capping layer 111 is formed on the N-type dopant source 106. The capping layer 110 may comprise silicate, for example. During the curing step, the capping layers 110 and 111 prevent outgassing dopants from either dopant source from diffusing into the other. Either one or both capping layers may be employed depending on the application. The capping layer 110 blocks dopants in the chamber from diffusing into the P-type dopant source 105. The capping layer 110 also prevents dopants from the P-type dopant source 105 from outgassing into the chamber and possibly counterdoping the N-type dopant source 106 or other materials of the solar cell. The capping layer 111 blocks dopants from N-type dopant source 106 from outgassing and diffusing into the P-type dopant source 105, and also blocks other dopants in the chamber from diffusing into the N-type dopant source 106. In FIG. 8, the front side surface of the substrate 101 and the trench 115 are randomly textured as in FIG. 5.

Solar cell structure and fabrication processes that include counter doping prevention have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of fabricating a solar cell, the method comprising:
   forming a layer of polysilicon over a backside of a solar cell substrate, the solar cell substrate having a front side facing the sun to receive solar radiation during normal operation, the backside opposite the front side;
   printing a first dopant source over the layer of polysilicon, the first dopant source comprising printable inks;
   curing the first dopant source to diffuse dopants from the first dopant source to the layer of polysilicon to form a first diffusion region in the layer of polysilicon;
   preventing counterdoping of dopants from the first dopant source to a second dopant source during the curing of the first dopant source, wherein preventing counterdoping of dopants from the first dopant source to the second dopant source comprises purging dopants from the first dopant source out of a chamber during the curing of the first dopant source; and
   texturing a surface formed over the front side of the solar cell substrate.

2. The method of claim 1 wherein the curing of the first dopant source also cures the second dopant source to diffuse dopants from the second dopant source to form a second diffusion region in the layer of polysilicon.

3. The method of claim 1 wherein purging dopants from the first dopant source out of the chamber during the curing of the first dopant source comprises:
   flowing an inert gas through the chamber.

4. The method of claim 1 wherein purging dopants from the first dopant source out of the chamber during the curing of the first dopant source comprises:
   curing the first dopant source in a chamber under vacuum.

5. The method of claim 1 wherein the first and second dopant sources are printed by inkjet printing.

6. The method of claim 1 wherein the first and second dopant sources are printed in one pass of an inkjet printing process.

* * * * *